United States Patent [19]

Yamada

[11] Patent Number: 4,967,417
[45] Date of Patent: Oct. 30, 1990

[54] LASER DRIVING DEVICE PROVIDED WITH TWO REFERENCE SIGNAL SOURCES, AND OPTICAL INFORMATION RECORDING APPARATUS USING THE SAME DEVICE

[75] Inventor: Etsuo Yamada, Sagamihara, Japan
[73] Assignee: Canon Kabushiki Kaisha, Tokyo, Japan
[21] Appl. No.: 377,131
[22] Filed: Jul. 10, 1989

[30] Foreign Application Priority Data

Jul. 12, 1988 [JP] Japan .................................. 63-171743

[51] Int. Cl.⁵ ............................................... H01S 3/10
[52] U.S. Cl. ........................................ 372/29; 372/31; 372/38
[58] Field of Search ............................. 372/38, 29, 31; 367/116, 122

[56] References Cited

U.S. PATENT DOCUMENTS 4,806,873 2/1989 Nagano ........................... 372/31

Primary Examiner—James W. Davie
Attorney, Agent, or Firm—Fitzpatrick, Cella, Harper & Scinto

[57] ABSTRACT

A laser driving device is disclosed. The laser driving device includes a semiconductor laser, a current source for supplying an electric current to the semiconductor laser, a photodetector for monitoring light emitted from the semiconductor laser, a plurality of setting circuits for outputting reference signals of different levels, a switching circuit for selecting one of the outputs of the setting circuits, a comparing circuit for comparing the output selected by the switching circuit with the output of the photodetector, and a control circuit for controlling the electric current supplied to the semiconductor laser on the basis of the output of the comparing circuit so that the two outputs become equal to each other. Also disclosed is an optical information recording apparatus using such a laser driving device.

5 Claims, 6 Drawing Sheets

FIG. 7B REFERENCE VOLTAGE

FIG. 7C LIGHT POWER

LASER DRIVING DEVICE PROVIDED WITH TWO REFERENCE SIGNAL SOURCES, AND OPTICAL INFORMATION RECORDING APPARATUS USING THE SAME DEVICE

BACKGROUND OF THE INVENTION

1. Field of the Invention

This invention relates to a laser driving device suitable for use in an optical information recording apparatus and to an optical information recording apparatus using such a laser driving device.

2. Related Background Art

Various forms such as a disk-like form or a cardlike form, are known as types of a medium on which information is recorded by the use of light and from which the recorded information is read out. Of these, an optical information recording medium formed into the shape of a card (hereinafter referred to as an "optical card") expects a great demand as a medium of large recording capacity, which is compact, light in weight and convenient for carrying.

Figure 1:
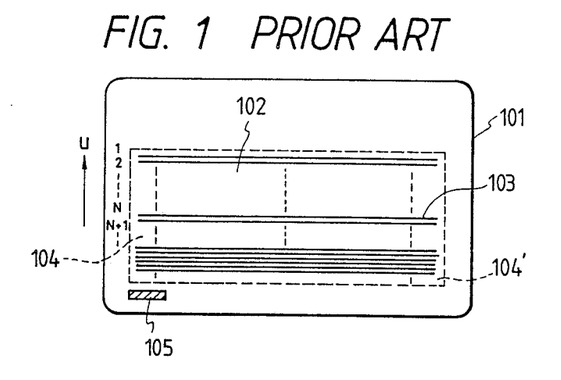
FIG. 1 is a schematic plan view showing an example of a prior art optical card.

Referring to FIG. 1 of the accompanying drawings, which is a schematic plan view of such an optical card 101, reference numeral 102 designates an information recording area, reference numeral 103 denotes information tracks, reference numerals 104 and 104' designate track selecting areas, and reference numeral 105 denotes the home position of a light beam spot.

Figure 2:
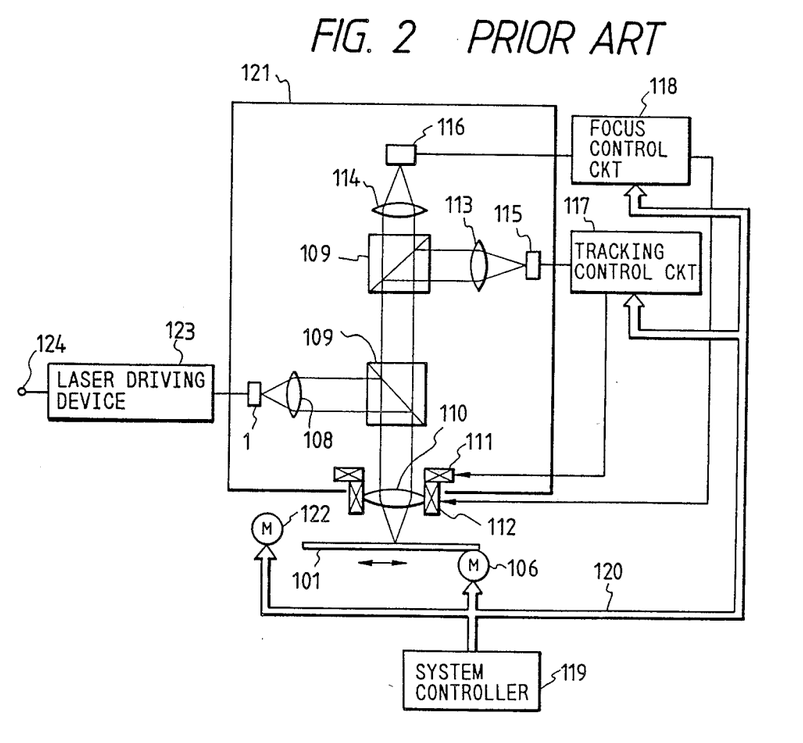
FIG. 2 is a schematic diagram showing an example of the construction of an apparatus for recording information on the optical card shown in FIG. 1.

Referring now to FIG. 2 of the accompanying drawings, which shows the construction of an apparatus for recording and reproducing information on the optical card, reference numeral 106 designates a motor for driving the optical card 101 in the direction of the double-headed arrow, reference numeral 1 denotes a semiconductor laser, reference numeral 108 designates a collimator lens for collimating the light from the semiconductor laser 1, reference numeral 109 denotes a beam splitter, reference numeral 110 designates an objective lens, reference numeral 111 denotes a coil for tracking, reference numeral 112 designates a coil for focusing, reference numerals 113 and 114 denote condensing lenses, the reference numerals 115 and 116 designate photoelectric converting elements, reference numeral 117 denotes a tracking control circuit, and reference numeral 118 designates a focusing control circuit. On the basis of a tracking signal and a focusing signal detected by the photoelectric converting elements 115 and 116, an electric current is supplied to the coil 111 for tracking and the coil 112 for focusing in accordance with the commands from the control circuits 117 and 118, whereby the objective lens 110 is moved to effect auto tracking and auto focusing. The reference numeral 119 denotes a system controller for controlling recording-reproducing apparatus, and reference numeral 120 designates a group of various control signals output from the system controller 119. Although not shown, signals other than the signals 120 are also output from the controller 119. The reference numeral 121 denotes an optical head, and reference numeral 122 designates a driving motor for moving the optical head in the direction indicated by arrow u shown in FIG. 1.

An electric current, modulated in conformity with an information signal input from a terminal 124, is supplied from a laser driving device 123 to the semiconductor laser 1.

In the above-described optical information recording-reproducing apparatus, recording of information is accomplished by condensing the light beam emitted from the semiconductor laser 1 into a minute spot of about several $\mu m$ by the objective lens 110, applying the minute spot to the optical card 101 and forming a pit differing in shape or reflectance from the surroundings. Also, reproduction of the recorded information is accomplished by applying a semiconductor laser light, of weaker light power than that during recording, to the recording portion of the optical card, and detecting any variation in the intensity of the reflected light from a recording layer.

Thus, during recording, when information is written, the semiconductor laser driving device must change between a laser light of high output and laser light of low output at a high speed in conformity with a recording signal and must cause them to be emitted from the semiconductor laser. During reproduction, when information is read, the laser driving device must to cause a laser light of low output to be output at a predetermined value.

However, the threshold current of the semiconductor laser varies due to temperature or lapse of time and therefore, even for the same driving current value, the light output value fluctuates due to the ambient temperature or lapse of time. During recording, this results in a factor which causes excess and deficiency in the state of writing onto the recording medium and reduces the reliability of the recorded information, and during reproduction, this results in a factor which aggravates the S/N ratio of the reproducing signal.

From the above-noted point, it is necessary, in the semiconductor laser driving device used in an optical information recording-reproducing apparatus, that laser light of stable high output and low output, respectively, be supplied.

Figure 3:
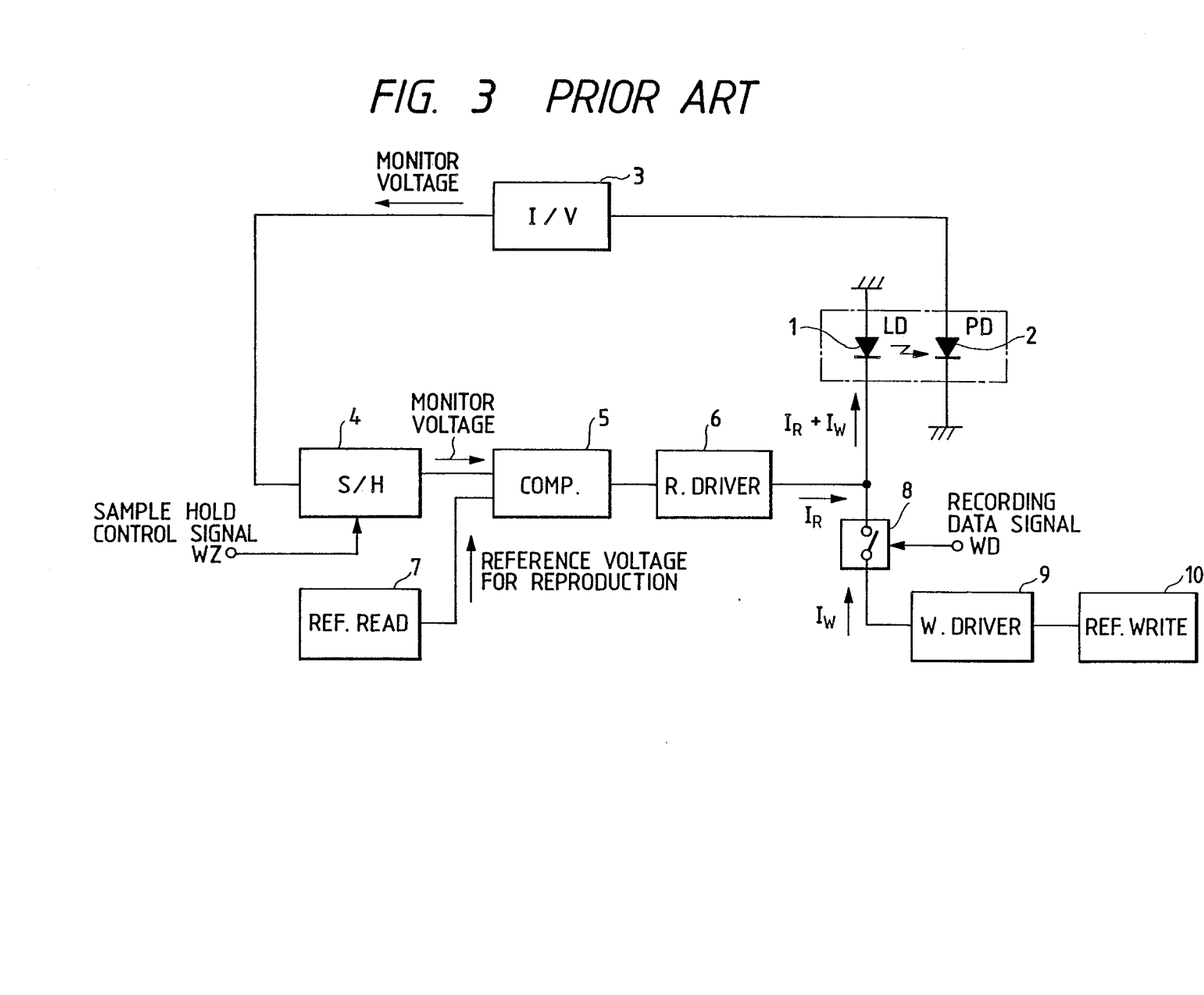
FIG. 3 is a block diagram showing an example of the prior-art laser driving circuit used in the apparatus shown in FIG. 2.

FIG. 3 of the accompanying drawings shows the construction of an example of the semiconductor laser driving device heretofore used. In this example, there are provided two laser drivers 6 and 9 for driving a semiconductor laser 1. During reproduction, only the output of the driver 6 for reproduction is supplied to the semiconductor laser 1, and during recording, the output of the driver 6 for reproduction is held and the output of the driver 9 for recording is superposed on the output of the driver 6, whereby a driving current for recording is obtained. The reference numeral 4 designates a sample hold circuit which holds when a L sample hold control signal WZ is at level H, and samples when the sample hold control signal WZ is L.

The operations during reproduction and recording will hereinafter be described in detail.

During reproduction, only the output current of the driver 6 for reproduction is supplied to the semiconductor laser 1. The driving current for reproduction is stabilized by inputting, to an error comparing circuit 5, a monitor voltage obtained by voltage-converting the photocurrent of a photodiode (PD) 2 for monitoring by a current-voltage (I/V) converter 3 and the output of a reference voltage setting circuit 7 for setting a laser power value for reproduction, and controlling the driver 6 for reproduction so that the monitor voltage becomes equal to the reference voltage.

During recording, the output of the I/V converter 3 is held by the sample hold circuit 4 immediately before a recording data signal WD is output, whereby the power for reproduction is fixed. The output current of the driver 9 for recording, controlled on the basis of a recording power reference voltage setting circuit 10, is switched on or off by a change-over switch 8 in accordance with the recording data signal WD and a recording signal current is superposed on a reproduction driving current, whereby a recording power is obtained. However, in this case, the control, which as during reproduction, the monitored value of the light power by the photodiode 2 for monitoring is compared with the reference voltage and corrected, is not effected. Also, the fixing of the power for reproduction by this holding is released when return is made to the reproducing mode.

Figure 4:
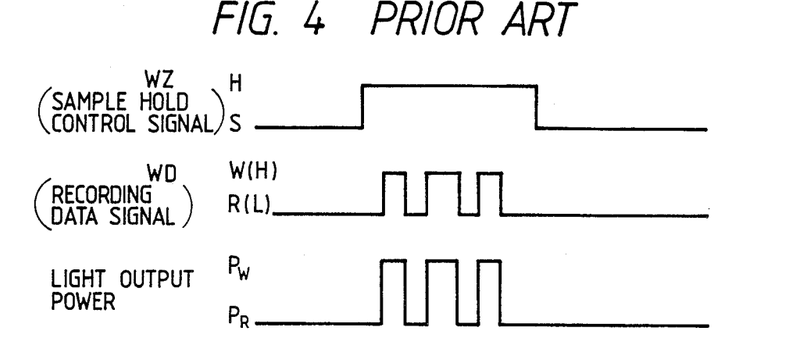
FIG. 4 shows the timing charts of signals in various portions of the device shown in FIG. 3.

The timing charts of the sample hold control signal WZ, the recording data signal WD and the light output power corresponding to the above-described instances are shown in FIG. 4 of the accompanying drawings.

In the prior-art system described above, the recording power $P_W$ cannot be stabilized for a variation in the ambient temperature and a variation with lapse of time. This is true, because the differential efficiency of the semiconductor laser (an inclination above the threshold value of the forward current-light output characteristic) fluctuates due to variation in temperature and variation with lapse of time.

Figure 5:
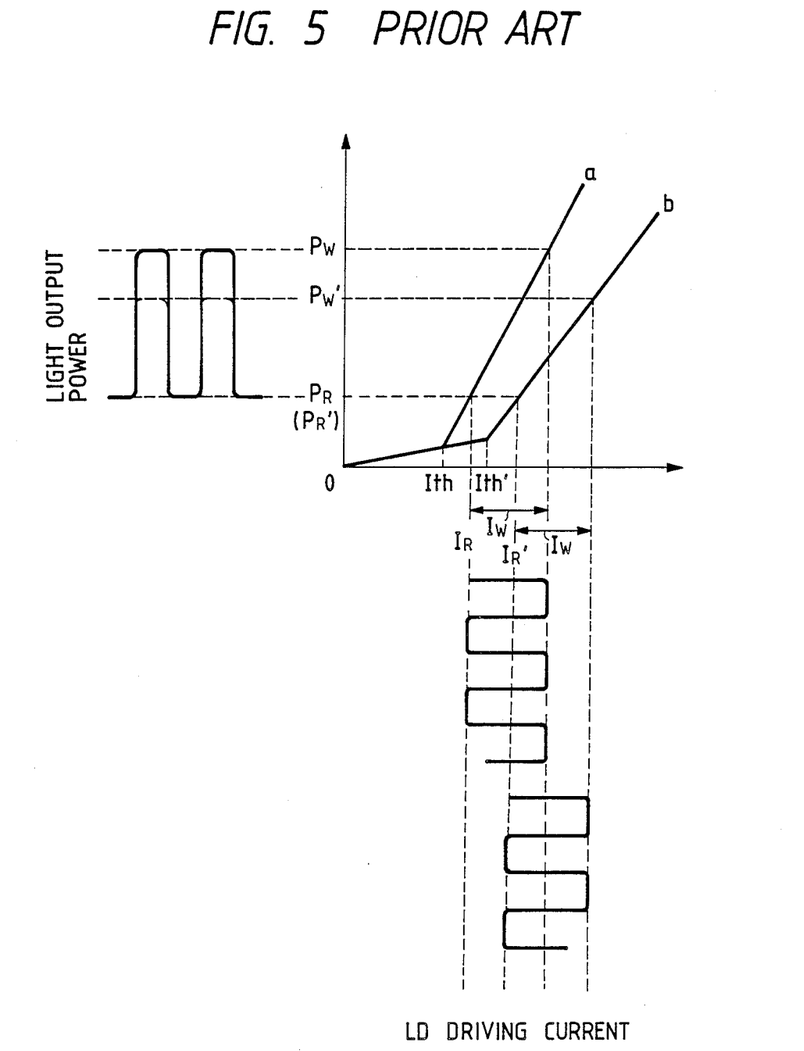
FIG. 5 shows the relation between the driving current and the light output in the device shown in FIG. 3.

Details thereof will now be described with reference to FIG. 5 of the accompanying drawings. In FIG. 5, a indicates the initial characteristic of the semiconductor laser, and b shows the characteristic after the initial characteristic a has been subjected to a variation with lapse, of time and a variation in temperature. In contrast with characteristic a, characteristic b is increased in threshold current $I_{th}$ and reduced in differential efficiency. It will be seen from this figure that even if the reproducing power $P_R$ changes from the characteristic a to the characteristic b, the current ($I_R \rightarrow I_R'$) is kept constant by an increase in by an increase in the reproduction driving current, while the recording power changes from $P_W$ to $P_W'$ and is not stabilized, because the recording power current $I_W$ superposed on the reproduction power current $I_R'$ remains unchanged.

SUMMARY OF THE INVENTION

It is an object of the present invention to solve the above-noted problems peculiar to the prior art and to provide a laser driving device for causing light of different powers to be selectively and stably output from a semiconductor laser and an optical information recording apparatus using such a device.

The above object of the present invention is achieved by a laser driving device comprising a semiconductor laser, a current source for supplying an electric current to said semiconductor laser, a photodetector for monitoring light emitted from said semiconductor laser, a plurality of setting circuits for outputting reference signals of different levels, a switching circuit for selecting one of the outputs of said setting circuits, a comparing circuit for comparing the output selected by said switching circuit with the output of said photodetector, and a control circuit for controlling the electric current supplied to said semiconductor laser on the basis of the output of said comparing circuit so that the two outputs become equal to each other.

DESCRIPTION OF THE PREFERRED EMBODIMENT

The present invention will hereinafter be described in detail with an optical card recording apparatus taken as an example.

Figure 6:
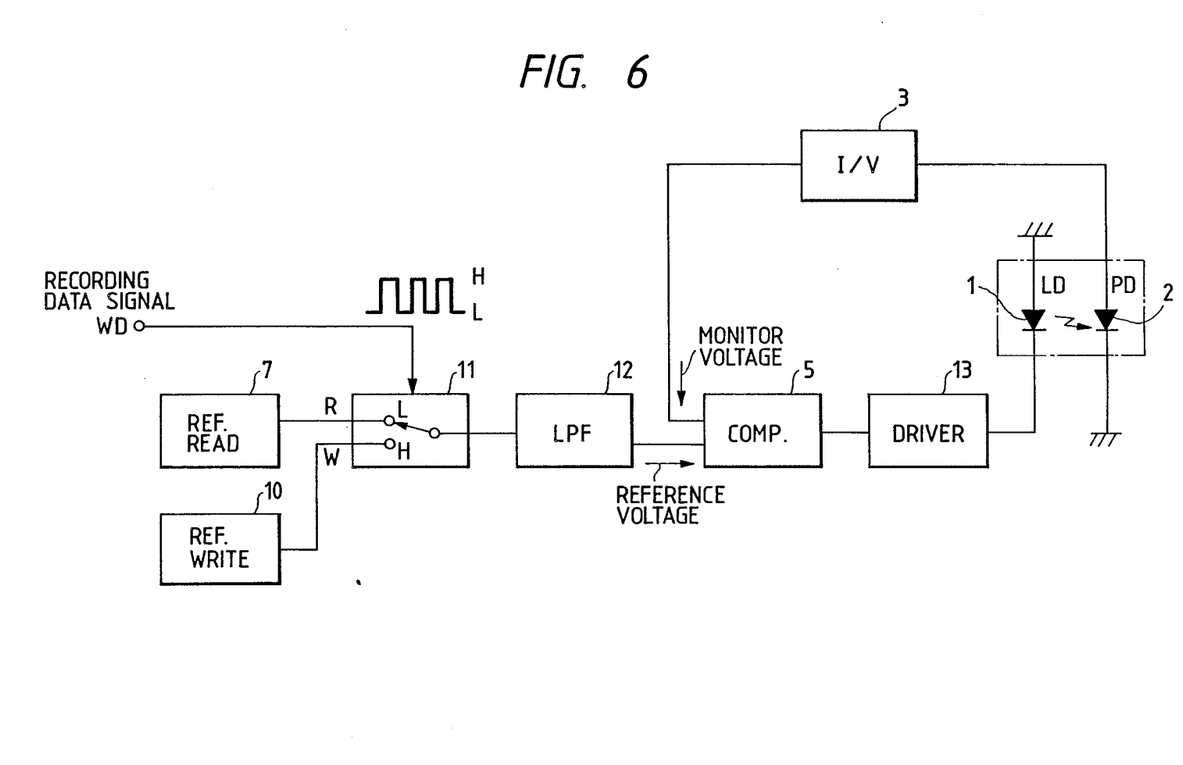
FIG. 6 is a block diagram showing an embodiment of the laser driving device of the present invention.
Figure 7A:
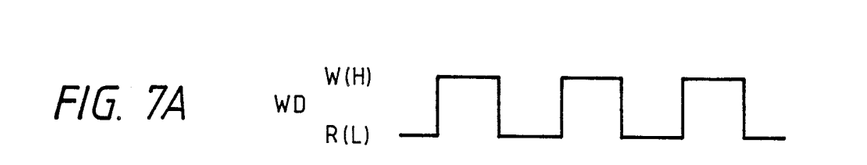
FIGS. 7A, 7B and 7C are the timing charts of signals in various portions of the device shown in FIG. 6.
Figure 7B:
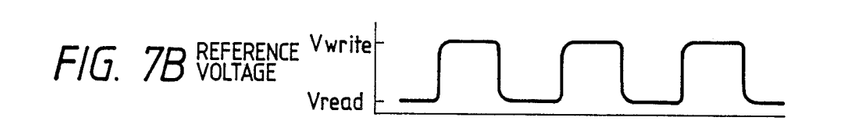
Figure 7C:
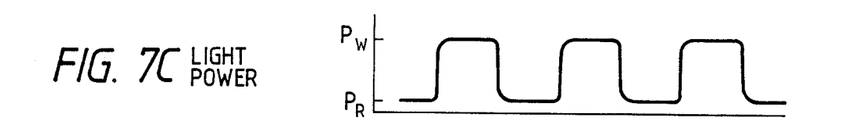

FIG. 6 is a block diagram showing an embodiment of the laser driving device of the present invention used in an optical card recording apparatus. This circuit is intactly incorporated into the construction shown in FIG. 2. Also, in this figure, like members to those in FIGS. 2 and 3 are given like reference characters and need not be described in detail. FIGS. 7A, 7B and 7C show the wave forms of the signals in various portions of the device of FIG. 6. The operation of the device of the present invention will hereinafter be described with reference to FIGS. 6 and 7.

The reference numerals 7 and 10 designate reference voltage setting circuits. The reference voltage setting circuit 7 is one for reproducing power, and the reference voltage setting circuit 10 is one for recording power. Reference voltages for recording and reproduction, respectively, are input to an analog switch 11.

The operation during recording will hereinafter be described.

The analog switch 11 is controlled by a recording data signal WD (shown in FIG. 7A), and selects the reproduction reference voltage when the signal is at level L, and selects the recording reference voltage when said this signal is at level H, and inputs them to a low-pass filter (LPF) 12. The low-pass filter 12 outputs a signal (shown in FIG. 7B) obtained by attenuating the high frequency component of the input signal. This signal provides the reference signal of an error comparing circuit 5, a laser driver 13, and a feedback loop comprised of a semiconductor laser 1, a photodiode 2 for monitoring and an I/V converting circuit 3, and a light output signal (shown in FIG. 7C) following it is output from the semiconductor laser 1. The laser driver 13 includes a current source for supplying an electric current to the semiconductor laser 1.

The low-pass filter 12 is provided to operate the feedback loop stably, and an appropriate cut-off frequency is set therein. Thereby, the prevention of the occurrence of ringing and distortion of the wave form of the light output and the prevention of damaging of the semiconductor laser 1 due to spike noise during the change-over of the analog switch 11, are accomplished.

The feedback loop receives the monitoring light of the semiconductor laser 1 by the photodiode 2, inputs to the error comparing circuit 5 a monitoring signal obtained by converting the photocurrent produced there into a voltage by the current-voltage (I/V) converter 3 and the aforementioned reference signal, and controls the electric current supplied to the semiconductor laser 1 through the laser driver 13 so that these two signals become equal to each other.

The operation during recording, i.e., during the inputting of the recording data signal, has been described above.

As regards the operation during reproduction, the recording data signal is fixed at level L and the reproduction reference voltage is input to the feedback loop, whereby a stabilized reproducing power is obtained.

Figure 8:
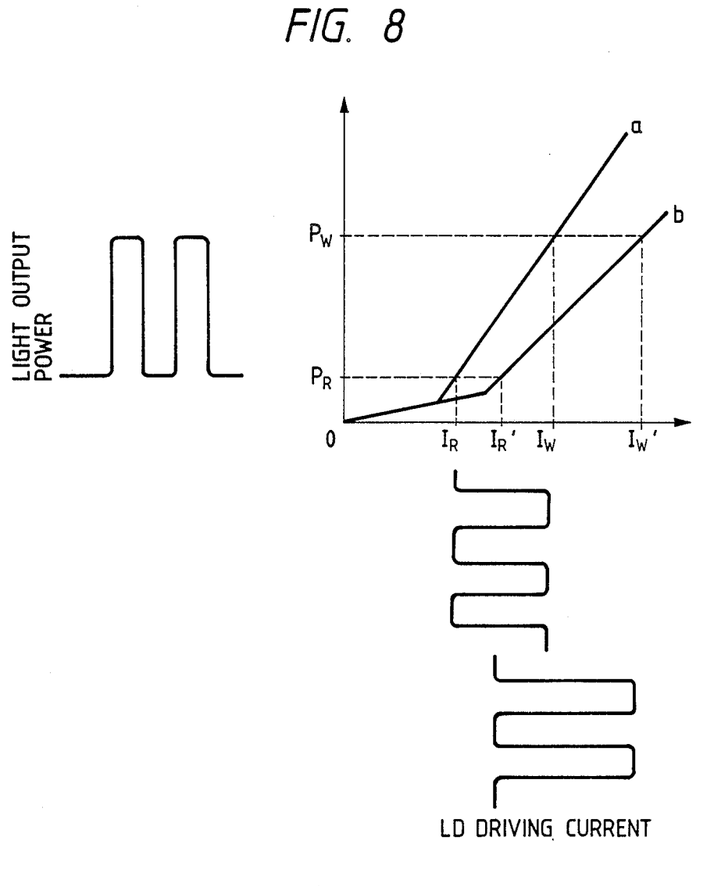
FIG. 8 shows the relation between the driving current and the light output in the device shown in FIG. 6.

FIG. 8 shows the manner in which the light power is controlled in the present embodiment. In FIG. 8, as previously described, a indicates the initial characteristic of the semiconductor laser, and b shows the characteristic after a variation with lapse of time and a variation in temperature. In the characteristic a, the light output modulated by the recording data signal stabilizes the recording power $P_W$ and the reproducing power $P_R$ by controlling the semiconductor laser reproduction driving current $I_R$ and recording driving current $I_W$. It will be seen that even if the characteristic changes to b, the driving currents change to $I_R$, and $I_W$, and the light output is stable.

The present invention permits various applications besides the above-described embodiment. For example, the laser driving device of the present invention can be suitably used not only in the aforedescribed optical card recording apparatus, but also in other optical information recording apparatuses.

The present invention covers all such applications without departing from the scope thereof as defined in the appended claims.

I claim:

1. A laser driving device comprising:
   a semiconductor laser;
   a current source for supplying electric current to said semiconductor laser;
   a photodetector for monitoring light emitted from said semiconductor laser and for generating a photodetector output;
   a plurality of setting circuits for outputting reference signals of different levels;
   a switching circuit for selecting one of the reference signals output from said setting circuits and for outputting the selected reference signal;
   a comparing circuit for comparing the reference signal output selected by said switching circuit with the output of said photodetector and for generating a comparison output;
   a low-pass filter for filtering the reference signal output from said switching circuit and for inputting the filtered reference signal to said comparing circuit; and
   a control circuit for controlling the electric current supplied to said semiconductor laser on the basis of the output of said comparing circuit so that the reference signal output and the photodetector output equal each other.

2. A laser driving device according to claim 1, wherein said photodetector comprises a photodiode and a circuit for current-voltage-converting the output of said photodiode.

3. An apparatus for applying a light beam to an optical recording medium and for recording an information signal thereon, said apparatus comprising:
   a semiconductor laser for emitting the light beam;
   a current source for supplying electric current to said semiconductor laser;
   a photodetector for receiving a portion of the light beam emitted from said semiconductor laser and for generating a photodetector output;
   a first setting circuit for outputting a reference signal having a first level;
   a second setting circuit for outputting a reference signal having a second level, lower than the first level;
   a switching circuit for selectively outputting one of the outputs from said first and second setting circuits and for switching the outputs in accordance with the information signal;
   a comparing circuit for comparing the output of said switching circuit with the output of said photodetector and for generating a comparison output;
   a low-pass filter for filtering the output from said switching circuit and for inputting the filtered output to said comparing circuit; and
   a control circuit for controlling the electric current supplied to said semiconductor laser on the basis of the output of said comparing circuit so that the reference signal output and the photodetector output equal each other.

4. An apparatus according to claim 3, wherein the first level corresponds to the intensity of the light beam at which recording is effected on the medium and the second level corresponds to the intensity of the light beam at which no recording is effected on the medium.

5. An apparatus according to claim 3, wherein said photodetector comprises a photodiode and a circuit for current-voltage-converting the output of said photodiode.

* * * * *

UNITED STATES PATENT AND TRADEMARK OFFICE
CERTIFICATE OF CORRECTION

PATENT NO. : 4,967,417

DATED : October 30, 1990

INVENTOR(S) : Etsuo Yamada

It is certified that error appears in the above-identified patent and that said Letters Patent is hereby corrected as shown below:

COLUMN 1

Line 14, "forms" should read --forms;--; and
Line 53, "auto tracking and auto focusing" should read --auto-tracking and auto-focusing--.

COLUMN 2

Line 14, "and" should read --and a--;
Line 15, "a" (first occurrence) should be deleted;
Line 18, "to" should be deleted;
Line 47, "L" should be deleted; and
Line 50, "is" should read --is at level--.

COLUMN 3

Line 6, "control," should read --control, in--;
Line 31, "lapse," should read --lapse--;
Line 33, "$I_{th}$and" should read --$I_{th}$ and--; and
Line 37, "by an increase in" (second occurrence) should be deleted.

UNITED STATES PATENT AND TRADEMARK OFFICE
CERTIFICATE OF CORRECTION

PATENT NO. : 4,967,417

DATED : October 30, 1990

INVENTOR(S) : Etsuo Yamada

It is certified that error appears in the above-identified patent and that said Letters Patent is hereby corrected as shown below:

COLUMN 4

Line 46, "said" should be deleted.

COLUMN 5

Line 20, "$P_w$and" should read --$P_w$ and--.

Signed and Sealed this

Thirtieth Day of June, 1992

Attest:

DOUGLAS B. COMER

Attesting Officer

Acting Commissioner of Patents and Trademarks